US008392792B2

(12) United States Patent
Yoon et al.

(10) Patent No.: US 8,392,792 B2
(45) Date of Patent: Mar. 5, 2013

(54) METHOD FOR ENCODING LOW DENSITY PARITY CHECK CODES USING RESULT OF CHECKING PREVIOUSLY SPECIFIED PARITY BITS

(75) Inventors: Chan-Ho Yoon, Daejon (KR); Jong-Ee Oh, Daejon (KR); Min-Ho Cheong, Daejon (KR); Yu-Ro Lee, Daejon (KR); Sok-Kyu Lee, Daejon (KR); Hee-Jung Yu, Daejon (KR); Seung-Chan Bang, Daejon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 910 days.

(21) Appl. No.: 12/443,688

(22) PCT Filed: Oct. 1, 2007

(86) PCT No.: PCT/KR2007/004785
§ 371 (c)(1),
(2), (4) Date: Mar. 30, 2009

(87) PCT Pub. No.: WO2008/039035
PCT Pub. Date: Apr. 3, 2008

(65) Prior Publication Data
US 2010/0031116 A1 Feb. 4, 2010

(30) Foreign Application Priority Data

Sep. 29, 2006 (KR) .................. 10-2006-0096274

(51) Int. Cl.
*H03M 13/00* (2006.01)
(52) U.S. Cl. ....................................... 714/758
(58) Field of Classification Search ................... 714/758
See application file for complete search history.

(56) References Cited

U.S. PATENT DOCUMENTS 6,961,888 B2 11/2005 Jin et al.
7,406,647 B2 * 7/2008 Lakkis .......................... 714/758
(Continued)

FOREIGN PATENT DOCUMENTS

KR 1020040092922 11/2004
KR 1020050035729 4/2005
(Continued)

OTHER PUBLICATIONS

Richardson, Thomas J. et al., "Efficient Encoding of Low-Density Parity-Check Codes," *IEEE Transactions on Information Theory*, vol. 47(2):638-656 (2001).

*Primary Examiner* — Albert Decady
*Assistant Examiner* — Enam Ahmed
(74) *Attorney, Agent, or Firm* — Nelson Mullins Riley & Scarborough LLP; EuiHoon Lee, Esq.

(57) ABSTRACT

There is provided to a method for encoding an LDPC (Low Density Parity Check) code using the result of checking a previously specified parity, including the steps of: forming a parity bit check matrix having a dual diagonal structure consisting of (N-K) rows for check nodes and (N-K) columns on the basis of the H matrix; calculating the values of all the parity bits by inserting a given binary value in sub-blocks, with the parity bit check matrix formed on the H matrix; if the values of the parity bits are incorrect, checking the parity bit corresponding to the sub-block located in the last part of the H matrix; searching the parity bit parts where the parity bit check result is represented as "1"; performing an XOR operation in sub-blocks on the parity bit part obtained through a simultaneous equation between the parity bits of the searched parity bit parts and the parity bit parts; and determining the value of the parity bit satisfying the condition that the value obtained by multiplying the H matrix by a code word vector.

7 Claims, 7 Drawing Sheets

U.S. PATENT DOCUMENTS

| | | |
|---|---|---|
| 2004/0148560 A1 | 7/2004 | Hocevar |
| 2004/0221223 A1 | 11/2004 | Yu et al. |
| 2006/0190801 A1* | 8/2006 | Shin et al. .................... 714/758 |
| 2007/0011566 A1* | 1/2007 | Gray et al. .................... 714/758 |
| 2009/0106625 A1* | 4/2009 | Jun et al. ....................... 714/758 |

FOREIGN PATENT DOCUMENTS

| | | |
|---|---|---|
| KR | 1020060061145 | 6/2006 |
| WO | WO-03/065591 A2 | 8/2003 |
| WO | WO-2005/036758 A1 | 4/2005 |

* cited by examiner

Cyclic shift 0

Cyclic shift 2

METHOD FOR ENCODING LOW DENSITY PARITY CHECK CODES USING RESULT OF CHECKING PREVIOUSLY SPECIFIED PARITY BITS

RELATED APPLICATIONS

This application is a 35 U.S.C. §371 national stage filing of International Application No. PCT/KR2007/004785 filed on Oct. 1, 2007, which claims priority to, and the benefit of, Korean Patent Application No. 10-2006-0096274 filed on Sep. 29, 2006. The contents of The aforementioned applications are hereby incorporated by reference.

TECHNICAL FIELD

The present invention relates to a method for encoding an LDPC (Low Density Parity Check) code; and more particularly, to a method for encoding an LDPC code using the result of checking specified parity bits, which specifies values of parity bits in advance and obtains final parity bits in parallel in sub-matrices inversely through a simultaneous equation by using the result of checking the parity of specified values utilizing a parity check matrix of a dual diagonal structure.

This work was partly supported by the Information Technology (IT) research and development program of the Korean Ministry of Information and Communication (MIC) and/or the Korean Institute for Information Technology Advancement (IITA) [2007-S-002-01, "IMT-Advanced Radio Transmission Technology with Low Mobility"] and the National Research Laboratory (NRL) program of the Korean Ministry of Science and Technology (MOST)/the Korea Science and Engineering Foundation (KOSEF) [2007-S-002-01, "IMT-Advanced Radio Transmission Technology with Low Mobility"].

BACKGROUND ART

An LDPC code has not been used due to limitations in hardware technical capabilities in spite of excellent performance closed to the Shannon limit, but recently active researches are being conducted on the LDPC code as a channel coding technique for reducing an error rate resulting from high speed communication in next generation wired/wireless communication systems.

Such an LDPC code is on the presumption that encoding is performed in a systematic manner. In other words, a part of a packet is outputted in the same format as input bits, and the other part of the packet is outputted as additional information called parity bits (code check bits) along with the original information.

As mentioned above, every input signal has to be inputted to an LDPC code encoder so as to perform an encoding operation thereof. The ratio of parity bits in the entire packet is varied depending on a code rate. Such a code rate is fixed by an H matrix.

Meanwhile, as a prior art LDPC code encoding technique, there is an article, entitled "Efficient Encoding of Low Density Parity Check Codes" proposed by Richardson (see IEEE Transactions On Information Theory Vol. 47, NO. 2, Feb. 2, 2001).

In such a prior art technique, the H matrix is first divided into sub-matrices. Then, when an input vector of a simultaneous equation of the matrix is given, output parity bits thereof are generated.

Recently, an LDPC code encoding technique, which is simpler than the LDPC code encoding technique by Richardson set forth above, has been proposed in IEEE 802.16e by Motorola Inc. This LDPC code encoding technique encodes an LDPC code by obtaining parity bits directly through a simultaneous equation, rather than by matrix operation.

However, the LDPC code encoding technique by Richardson has the problem that it is not easy to process signals at a high speed due to the operation for dividing into sub-matrices, and the LDPC code encoding technique by Motorola Inc. has the problem that encoding complexity and hardware resource load increase considerably because it directly derives parity bits.

Consequently, in the encoding of an LDPC code, there is an urgent need for a technique which is suitable for high speed communication and can minimize encoding complexity and resource consumption.

DISCLOSURE

Technical Problem

An embodiment of the present invention is directed to providing a method for encoding an LDPC code using the result of checking specified parity bits, which specifies values of parity bits in advance and obtains final parity bits in parallel in sub-matrices inversely through a simultaneous equation by using the result of checking the parity of specified values utilizing a parity check matrix of a dual diagonal structure.

Other objects and advantages of the present invention can be understood by the following description, and become apparent with reference to the embodiments of the present invention. Also, it is obvious to those skilled in the art of the present invention that the objects and advantages of the present invention can be realized by the means as claimed and combinations thereof.

Technical Solution

In accordance with an aspect of the present invention, there is provided to a method for encoding an LDPC (Low Density Parity Check) code using the result of checking a previously specified parity, wherein a procedure of determining parity bit parts in an H matrix used for LDPC code encoding of an information sequence of length K to a codeword of length N includes the steps of: forming a parity bit check matrix having a dual diagonal structure consisting of (N-K) rows for check nodes and (N-K) columns on the basis of the H matrix; calculating the values of all the parity bits by inserting a given binary value in sub-blocks, with the parity bit check matrix formed on the H matrix; if the values of the parity bits are incorrect as the result of checking the calculated values of the parity bits, checking the parity bit corresponding to the sub-block located in the last part of the H matrix; searching the parity bit parts where the parity bit check result is represented as "1" based on the result of checking the parity bits; performing an XOR operation in sub-blocks on the parity bit part obtained through a simultaneous equation between the parity bits of the searched parity bit parts and the parity bit parts into which an initially given binary value is inserted; and determining, as the value of the parity bit of the H matrix, the value of the parity bit satisfying the condition that the value obtained by multiplying the H matrix by a code word vector, which is encoded by the H matrix, corresponds to zero ("0").

Advantageous Effects

As described above and will be set forth below, the present invention is suitable for high speed communication and can minimize encoding complexity and resource consumption in the encoding of an LDPC code.

In addition, the present invention can efficiently encode an LDPC code by slightly changing the structure of an H matrix merely, while maintaining the structure of a parity check matrix in the same manner as an existing LDPC code encoding technique.

Furthermore, the present invention can accurately obtain the solution of the parity bits on the H matrix.

Moreover, in a device aspect, the present invention can perform an LDPC code encoding operation by changing the structure of an LDPC code decoder so as to correspond to the H matrix proposed by the invention.

BEST MODE

The advantages, features and aspects of the invention will become apparent from the following description of the embodiments with reference to the accompanying drawings, which is set forth hereinafter, and thus, the present invention will be easily carried out by those skilled in the art. Further, in the following description, well-known arts will not be described in detail if it seems that they could obscure the invention in unnecessary detail.

As will be described below, the present invention suggests a H matrix which has a structure where a cyclic shift value of a parity check matrix therein is changed, while maintaining a structure of the parity check matrix in the same way as an existing LDPC code encoding technique, by taking into consideration that an LDPC code encoding technique, which is suitable for high speed communication and can minimize encoding complexity and resource consumption, can be achieved through appropriate design of a parity check matrix.

In addition, in the present invention, a general LDPC code encoding technique by Richardson can be used as it is. Especially, sub-blocks of a given size are inserted as a solution of the parity bits in determining parity bits in LDPC code encoding so that the parity check matrix has a dual diagonal structure, thereby serially obtaining the other solutions of the parity bits. As for the wrong solutions of the parity bits, the initially given solution is inversely inserted in sub-blocks, thereby precisely obtaining the solution of the parity bits.

Hereinafter, a preferred embodiment of the present invention will be described in detail with reference to the accompanying drawings.

Figure 1:
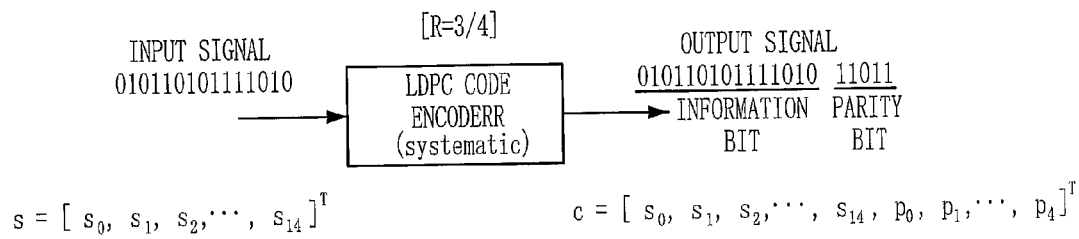
FIG. 1 is an explanatory diagram showing the concept of general LDPC code encoding.

FIG. 1 is an explanatory diagram illustrating the concept of general LDPC code encoding.

The basic idea of an LDPC code encoding technique is an "H matrix". A packet encoded through an H matrix in an encoder of a transmitting end is decoded through an H matrix in a decoder of a receiving end.

FIG. 1 illustrates an LDPC code encoder with a code rate of R=¾. As illustrated in FIG. 1, a 15-bit binary vector, which is an input signal, is sent out as an output signal it is as, and 5 parity bits are determined by the LDPC code encoder based on the input vector and sent out together as an output signal. For example, it can be seen that the code rate is "R=¾" as "input bit [15]/output bit [20]=¾".

Next, a structure of the H matrix suggested in the present invention will be described below with reference to FIGS. 2 to 8.

Figure 2:
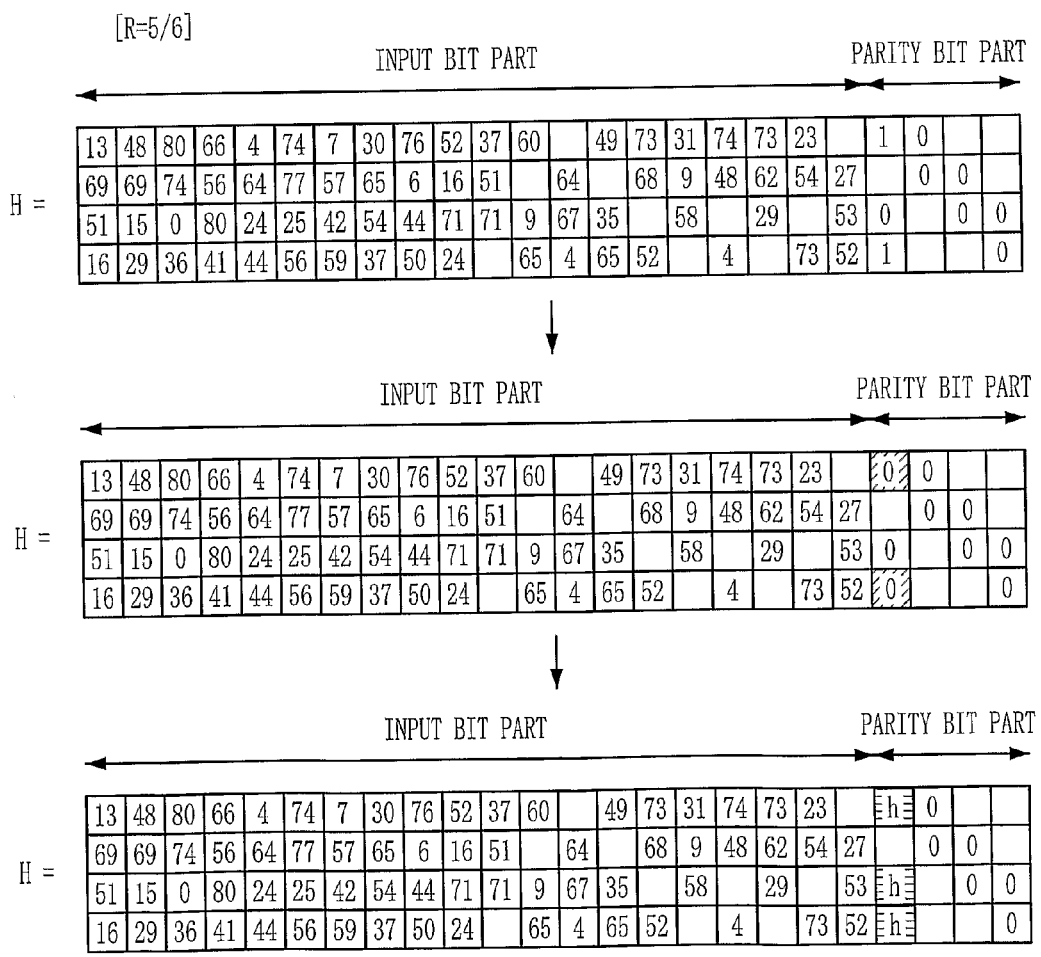
FIG. 2 shows that the top part thereof is an explanatory diagram showing an H matrix used in the present invention, and that the middle and bottom parts thereof are explanatory diagrams showing the H matrix suggested in the present invention.

The top part of FIG. 2 is an explanatory diagram illustrating an H matrix used in the present invention. The middle and bottom parts of FIG. 2 are explanatory diagrams illustrating an H matrix suggested in the present invention.

Figure 3:
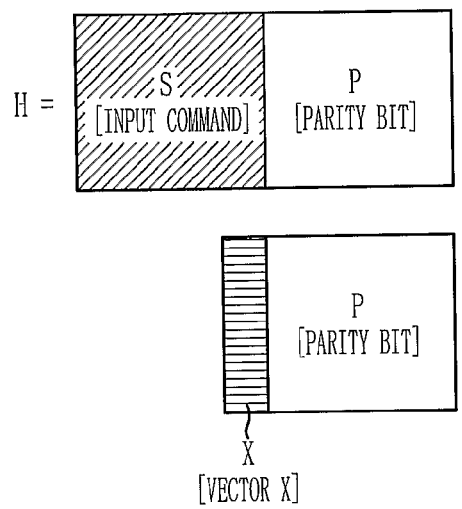
FIG. 3 is an explanatory diagram showing the concept of conversion from an input word into a vector x in accordance with the present invention.

FIG. 3 is an explanatory diagram illustrating the concept of conversion from an input word into a vector x in accordance with the present invention.

Figure 4:
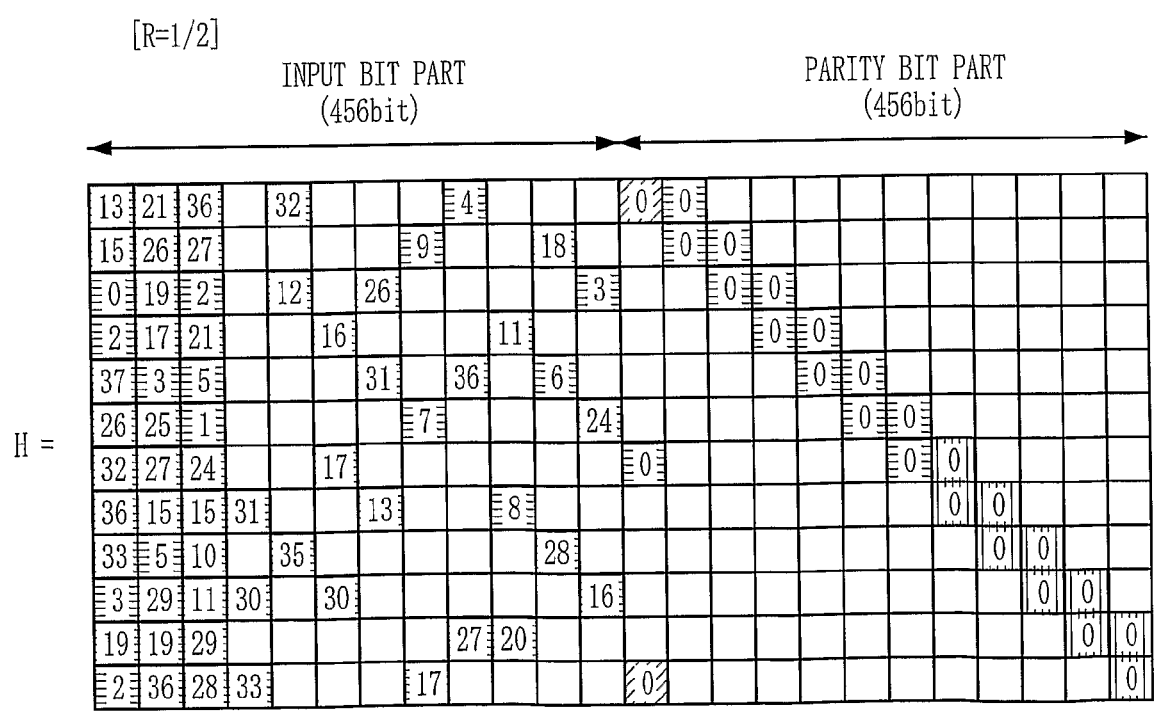
FIG. 4 is an explanatory diagram showing an H matrix in which the parity bit parts on the H matrix shown in FIG. 2 are all set to 0 in accordance with the present invention.

FIG. 4 is an explanatory diagram illustrating an H matrix in which the parity bit parts on the H matrix shown in FIG. 2 are all set to 0 in accordance with the present invention. The H matrix is formed in a structure having a code rate of "R=½" and a sub-block size of 38×38.

Figure 5:
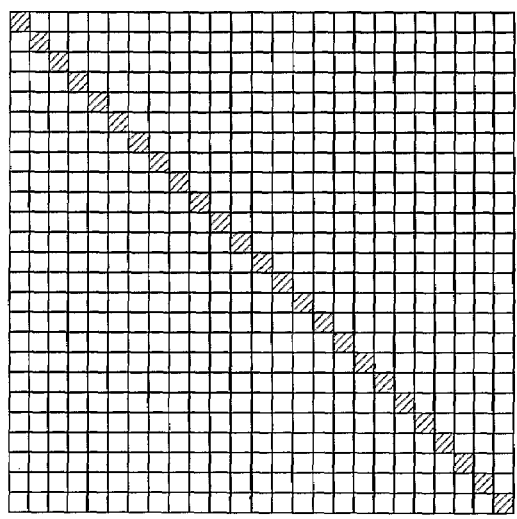
FIG. 5 is an explanatory diagram showing the concept of cyclic shift used in the present invention.
Figure 5:
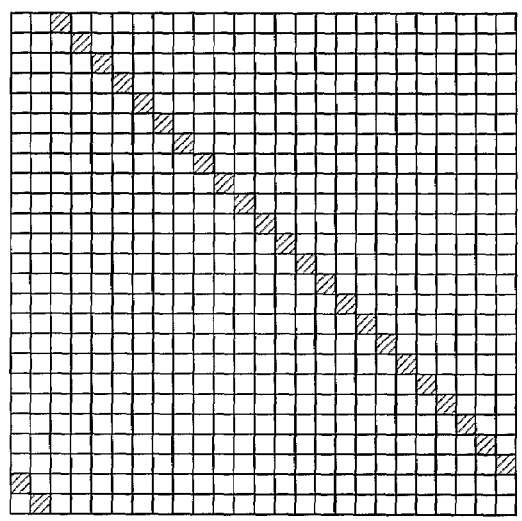

FIG. 5 is an explanatory diagram illustrating the concept of cyclic shift used in the present invention, wherein the left side of FIG. 5 illustrates cyclic shift 0, and the right side thereof illustrates cyclic shift 2.

FIG. 2 illustrates an H matrix which is to be applied to an LDPC code encoder consisting of cyclic shifts of a projection matrix. If the first matrix of the parity bit region on a general H matrix as shown in the top part of FIG. 2 is changed as in the middle and bottom parts thereof, it becomes an H matrix suggested in the present invention.

For example, the top part of FIG. 2 illustrates a structure of an H matrix having a code rate of "R=⅚" suggested in the IEEE 802.11n specification, standardization of which is in progress at present. Such an H matrix is configured in a matrix of sub-blocks of an 81×81 size. Further, the numerals on the H matrix represent the values of cyclic shifts.

FIG. 4 shows an example of cyclic shifts in an H matrix having a sub-block size of 38×38, wherein each of the sub-blocks has the structure of a circulant matrix.

Meanwhile, if each of the sub-blocks on the H matrix as shown in FIG. 3 is 81×81, the size of the H matrix of FIG. 3 is 324×1944.

Especially, the H matrix as shown in FIG. 3 has the structure of the H matrix proposed by Richardson. The H matrix, as shown in FIG. 2, can be divided into input bit parts and parity bit parts. The characteristic of this H matrix is that the parity bit parts have a dual diagonal structure.

As described above, the structure of the H matrix suggested in the present invention is characterized in that as shown in the middle portion of FIG. 2, the parity bit parts are all made in a zero cyclic shift, e.g., formed in identity matrices, and as shown in the bottom part of FIG. 2, the parity bits are determined in parallel at a time to the length of the diagonal portions of the sub-blocks.

Now, a procedure of determining parity bits in bits will be described below in detail with reference to FIG. 4, prior to describing the algorithm for determining parity bits in parallel at a time in sub-blocks as set forth above.

As shown in FIG. 4. it can be seen that the parts indicated as "☒" on the parity bit parts in an H matrix having a code rate of "R=½" are all modified as a zero cyclic shift. Here, the result of multiplying the H matrix by a code word vector c, which is encoded by the H matrix, should satisfy the following equation:

$$H \cdot c^T = 0 \qquad \text{Eq. (1)}$$

wherein a vector c represents an output vector c of the LDPC code encoder as shown in FIG. 1.

Based on the above Eq. (1), the LDPC code encoder determines the underlined parity bits of the output vector as shown in FIG. 1, and finds out 456 parity bits satisfying the equation "$H \cdot c^T = 0$" on the H matrix as shown in FIG. 4, i.e., 456 [38*12=456] parity bits because the number of sub-blocks is 38.

As mentioned above, the H matrix as shown in FIG. 4 is made in a matrix of sub-blocks, which consists of cyclic shifts as shown in FIG. 5.

Now, the procedure of finding out the 456 parity bits will be described below.

The 456 parity bits are defined as "$P_0, P_1, \ldots, P_{454}, P_{455}$", respectively.

Then, in order for the parity bit $P_0$ and the parity bit $P_1$ to satisfy Eq. (1) above, the sum of the input bits corresponding to the $1^{st}$ row, $13^{th}$ row, $59^{th}$ row, $112^{th}$ row, $184^{th}$ row, and $308^{th}$ row among the 456 rows and the parity bits corresponding to the $0^{th}$ row and $38^{th}$ row should be 0. In other words, it has to be an even number as being a modulo 2 operation. Here, the "$H \cdot c^T = 0$" operation for the $1^{st}$ row can be expressed as:

$$(H)_{j=0} \cdot c^T = S_{13} \oplus S_{59} \oplus S_{112} \oplus + S_{184} \oplus S_{308} \oplus P_0 \oplus P_{038} = 0 \qquad \text{Eq. (2)}$$

wherein, in Eq. (2), ⊕ represents a bit operation, i.e., a modulo 2 operation, which means that the operation of an LDPC code encoding process is a bit unit operation, and $(H)_j$ indicates a $j^{th}$ row of the H matrix.

As can seen from Eq. (2), $S_0, S_{59}, S_{112}, S_{184}$, and $S_{308}$ are given as input signals, but the parity bits $P_0$ and $P_{38}$ should be calculated.

Moreover, the 456 parity bits exist on the H matrix as shown in FIG. 4. Thus, in order to derive the solution of Eq. (2), all of the 456 parity bits "$P_0, P_1, \ldots, P_{454}, P_{455}$" should be obtained.

However, the values for the 456 parity bits cannot be obtained by simultaneous equations.

Therefore, in the present invention, by taking into consideration that if the value of a specific parity bit is preset, the values of the other parity bits can be obtained, an initial value of parity bit $P_0$ is set to 0 in advance, to thereby obtain the value of parity bit $P_{38}$ corresponding thereto. For instance, as the value of parity bit $P_{38}$ is known, the value of parity bit $P_{76}$ corresponding to the $38^{th}$ row of the H matrix is obtained by the following equation:

$$(H)_{j=38} \cdot c^T = S_{15} \oplus S_{64} \oplus S_{113} \oplus S_{275} \oplus S_{398} \oplus P_{38} \oplus P_{76} = 0 \qquad \text{Eq. (3)}$$

As can seen from Eq. (3), parity bit $P_{76}$ is located in the $38^{th}$ row. With the value of parity bit $P_{76}$ known, the value of parity bit $P_{114}$ located in the same $38^{th}$ row can be obtained, too. Here, parity bit $P_{114}$ has the value of the the $72^{th}$ row.

Through the aforementioned parity bit calculation process, the value of parity bit $P_{418}$ of the $380^{th}$ row is obtained, and the obtained value of parity bit $P_{418}$ becomes the value of parity bit $P_{418}$ in the $418^{th}$ row.

When the sum of the input bits corresponding to the $418^{th}$ row and the parity bits as above is 0, the values of the parity bits "$P_0, P_{38}, P_{76}, P_{114}, P_{152}, P_{190}, P_{228}, P_{266}, P_{304}, P_{418}$" are all determined as correct values.

On the other hand, the sup of the input bits corresponding to the $418^{th}$ row and the parity bits is not 0, the process returns to the first step, for example, the step of presetting an initial value of parity bit $P_0$, sets the initial value of parity bit $P_0$ to 1, and performs the subsequent steps.

By the way, the step of checking the values of the parity bits on the matrix if they are correct while changing the initial value of parity bit $P_0$ may require a large amount of operation to some extent. Thus, as another example of the present invention, it is preferable to determine final parity bits by XOR operation of the values of the parity bits "$P_0, P_{38}, P_{76}, P_{114}, P_{152}, P_{190}, P_{228}$" among the parity bits "$P_0, P_{38}, P_{76}, P_{114}, P_{152}, P_{190}, P_{228}, P_{266}, P_{304}, P_{418}$".

In further explanation, among the above parity bits, "$P_{266}, P_{304}, P_{418}$" are excluded from the XOR operation because the values of "$P_{266}, P_{304}, P_{418}$" are not changed. Namely, in the $228^{th}$ row, three parity bits have to be determined, which is based on the concept that once an odd number of first and second parity bits are determined, the other third parity bit always has a constant value.

As described above, the procedure of determining parity bits in bits in accordance with the present invention has been discussed. Hereinafter, the procedure of determining parity bits in parallel at a time in sub-blocks in the present invention will be described in detail with reference to FIGS. 6 and 7.

Figure 6:
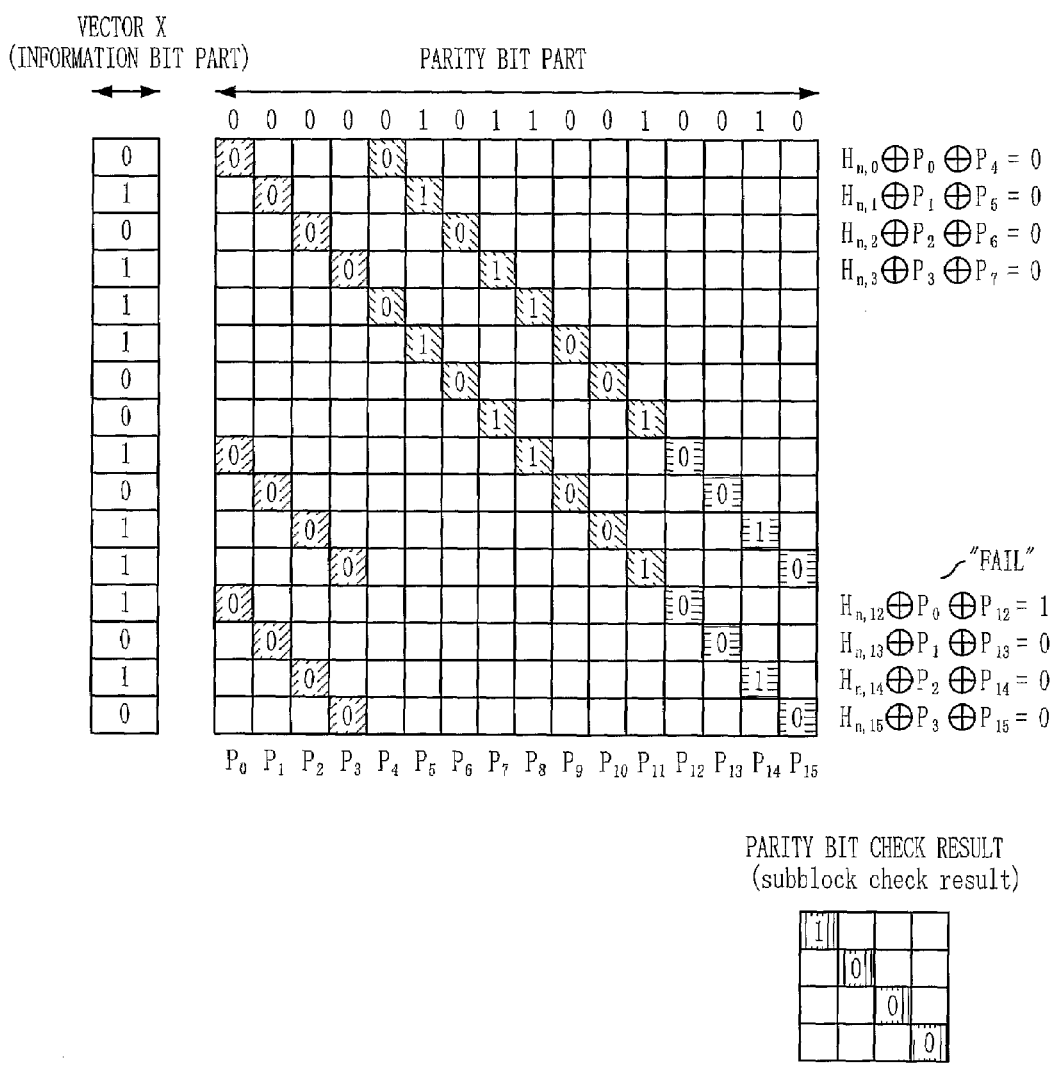
FIG. 6 is an explanatory diagram showing the result of operation of the parity part matrix of the H matrix in accordance with the present invention, which illustrates a case where its parity check result is a failure.
Figure 7:
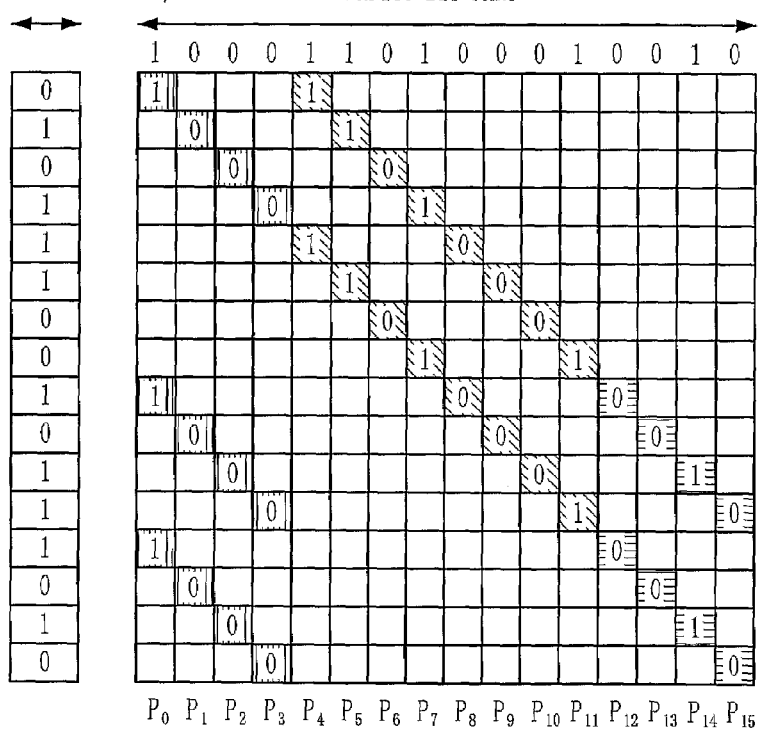
FIG. 7 is an explanatory diagram showing the result of operation of the parity part matrix of the H matrix in accordance with the present invention, which illustrates a case where its parity check result is modified by an XOR operation to determine final parity bits.

FIG. 6 is an explanatory diagram showing the result of operation of the parity part matrix of the H matrix in accordance with the present invention, which illustrates a case where its parity check result is a failure. FIG. 7 is an explanatory diagram of one embodiment showing the result of operation of the parity part matrix of the H matrix in accordance with the present invention, which illustrates a case where its parity check result is modified by an XOR operation to determine final parity bits. Here, the H matrix consists of sub-blocks of 4×4 size.

Regarding the procedure of determining parity bits in bits that has been described above with reference to FIG. 4, in the present invention, in accordance with the present invention, parity bits can be determined in parallel at a time in sub-blocks.

That is, once the parity bits "$P_0, P_{37}$" are determined, the parity bits "$P_0$" to "$P_{37}$" are determined directly through a sub-block-based parallel processing of the present invention.

As shown in each of FIGS. 6 and 7, the information bit part of the H matrix corresponds to vector x as shown in FIG. 3. The vector x is expressed by a modulo 2 operation. As for the vector x, the 0 row part on the H matrix as shown in FIG. 4 is expressed by the following equation:

$$(x)_{j=0} = S_{13} \oplus S_{59} \oplus S_{112} \oplus S_{184} \oplus S_{308} \oplus S_0 \oplus S_{38} \qquad \text{Eq. (4)}$$

wherein j represents the row of vectors x.

Now, in order to apply the H matrix as shown in FIG. 4 to the LDPC code encoder, the values of the vectors x corresponding to the 456 parity bits are generated by the above Eq. (4).

With all the vectors x generated by Eq. (4), if it is assumed that the size of the sub-block matrix on the H matrix is 4×4, an LDCP code encoding process thereof is as shown in FIG. 6.

In FIG. 6, the columns of the first sub-block of the parity bit parts indicated as "☒" are all initialized to 0. This means that the parity bits "$P_0, P_1, P_2, P_3$" are all set to 0.

As described above with reference to FIG. 4, the parity bits "$P_4, P_5, P_6, P_7$" can be obtained as "0, 1, 0, 1" by Eq. (1), and then the parity bits "$P_8, P_9, P_{10}, P_{11}$" and "$P_{12}, P_{13}, P_{14}, P_{15}$" can be obtained sequentially.

Then, a parity check result, i.e., Eq. (1), of the parity bits finally obtained for the $12^{th}$ row to the $15^{th}$ row can be represented in sub-blocks indicated as "▥" in FIG. 6 (sub-block check result).

Among the sub-blocks indicated as "▥" in FIG. 6, if there exists any part which is not 0, for example, which is 1, ☒ means a failure of the parity check result, i.e., a failure in generating a desired LDPC code (which does not satisfy Eq. (1)). It can be seen from FIG. 6 that the parity bits of the $12^{th}$ row are wrong.

In such a case, as the parity check result is a failure in FIG. 6, it has to be modified to determine final parity bits. This process will be illustrated in FIG. 7.

Namely, the parity check result of FIG. 6, for example, the sub-blocks indicated as "▥",, is obtained by performing an XOR operation on the sub-blocks of the parity bit parts indicated as "☒" in FIG. 6 and the sub-blocks of the parity bit parts indicated as "◨" therein.

Then, the result as shown in FIG. 7 can be obtained as a result of the XOR operation. Especially, by performing a parity bit check on the $12^{th}$ row to $15^{th}$ row, the sub-blocks indicated as "▦" in FIG. 7 can be obtained.

That is, FIG. 7 shows that the parity bits "$P_0$" to "$P_{15}$" satisfying Eq. (1) are finally obtained.

It should be noted in the determination of final parity bits that the parity bit parts indicated as "▤" in FIG. 7 is excluded in the XOR operation.

This can be seen, for example, through the step of modifying the H matrix as shown in FIG. 6 to the H matrix as shown in FIG. 7. This means that even if the values of the sub-blocks of the parity parts indicated as "▥" in FIG. 6, sub-blocks of the parity parts indicated as "◨" in FIG. 6, sub-blocks of the parity parts indicated as "▥" in FIG. 7, and sub-blocks of the parity parts indicated as "◨" in FIG. 7 are changed, the values of the sub-blocks of the parity bit parts indicated as "▤" are not changed. This is also applied to the procedure of determining parity bits in parallel in sub-blocks for the same reason as the determination of three parity bits in the procedure of determining parity bits in bits as described above with reference to FIG. 4.

In addition to the characteristic that parity bits are determined in parallel in sub-blocks, the parity bit determination process suggested in the present invention has another characteristic that it does not matter if the rows corresponding to the parity parts indicated as "▥" in FIG. 7 all have the same cyclic shift, for example, they do not exert any effect on LDPC code encoding. This will be described below with reference to FIG. 8.

Figure 8:
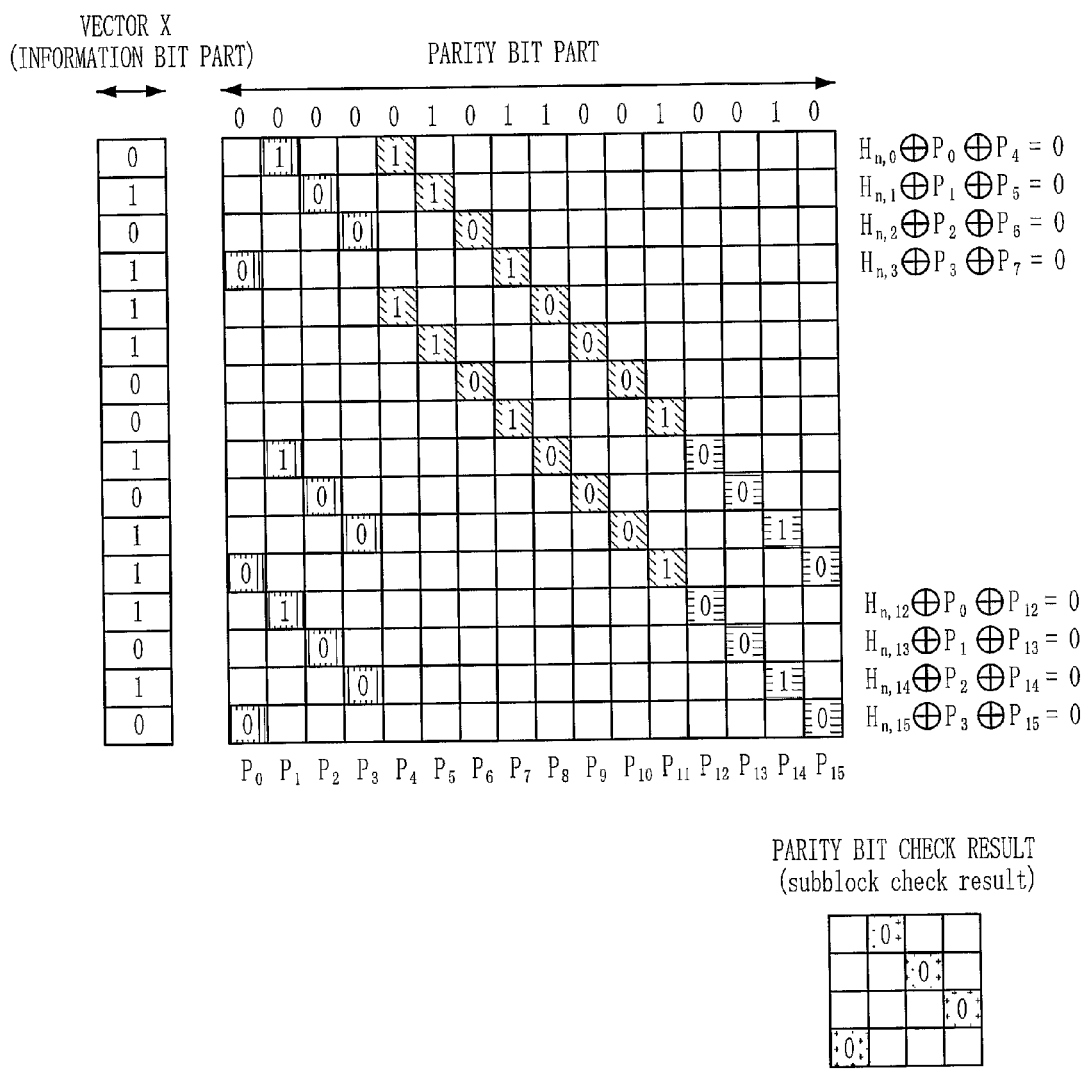
FIG. 8 is an explanatory diagram showing the result of operation of the parity part matrix of the H matrix when the cyclic shift of the $1^{st}$ row of the H matrix is performed in accordance with the present invention.

FIG. 8 is an explanatory diagram illustrating the result of operation of the parity part matrix of the H matrix when the cyclic shift of the $1^{st}$ row of the H matrix is performed in accordance with the present invention, wherein 1 cyclic shift is performed on the $1^{st}$ row.

As shown in FIG. 8, all the rows corresponding to the parity parts indicated as "▥" have the same cyclic shift. Although the cyclic shift of this type exerts an effect on the performance of LDPC code encoding to some extent, this LDPC code encoding has the same result as the above-described LDPC code encoding process in accordance with the present invention.

Hereinafter, in the LDPC code encoding process, the flow of the above-described procedure of determining parity bits of the present invention will be set forth with reference to FIG. 9.

Figure 9:
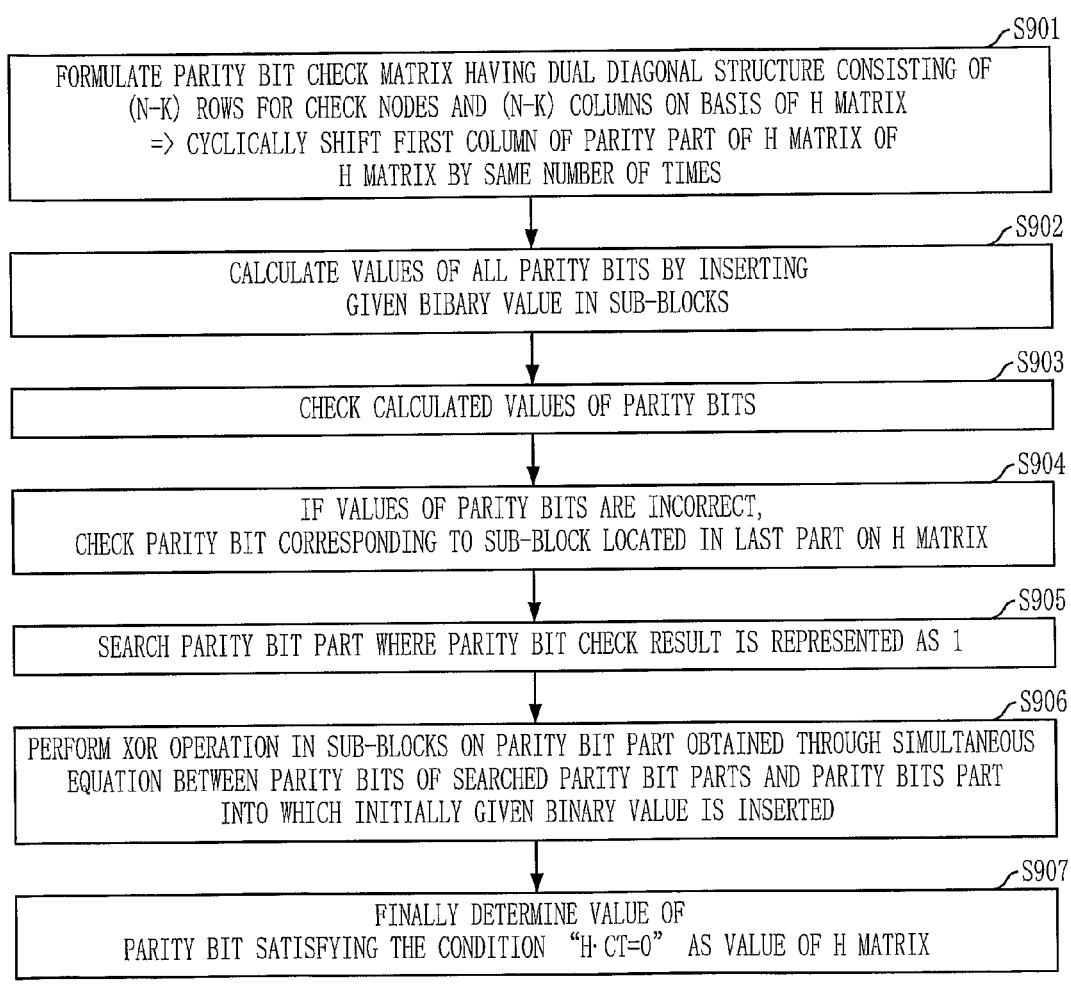
FIG. 9 is a flowchart illustrating a method for encoding an LDPC code using the result of checking a previously specified parity in accordance with a preferred embodiment of the present invention.

FIG. 9 is a flowchart illustrating a parity bit determination procedure in a method for encoding an LDPC code using the result of checking a previously specified parity in accordance with the present invention.

An LDPC code encoding process for encoding an information sequence of length K to a codeword of length N will be described below by way of example.

First, in the formation of a parity bit check matrix having a dual diagonal structure consisting of (N-K) rows for check nodes and (N-K) columns on the basis of an H matrix, the $1^{st}$ column of the parity parts of the H matrix is all cyclically shifted by the same number of times in step S901. In another example, in the formation of a parity bit check matrix, this parity bit check matrix may be formed in identity matrices.

Thereafter, with the parity bit check matrix formed on the H matrix, a given binary value is inserted in sub-blocks to calculate the values of all the parity bits in step S902.

The calculated values of the parity bits are checked in step S903. If the values of the parity bits are incorrect, the parity bit corresponding to the sub-block located in the last parts of the H matrix is checked in step S904. The parity bit part where the parity bit check result is represented as 1 is searched in step S905.

Then, an XOR operation is performed in sub-blocks on the parity bit part obtained through a simultaneous equation between the parity bits of the searched parity bit parts and the parity bit parts into which an initially given binary value is inserted in step S906. Finally, the values of the parity bits satisfying Eq. (1) of "$H \cdot c^T = 0$" are determined as the values of the H matrix in step S907.

Additionally, although an initial value of parity bit $P_0$ (i.e., an initial value of sub-blocks) is set to 0 in the present invention described above, even if a combination of random numbers of a given binary number is used as the initial value, a parity bit check of the sub-blocks corresponding to the last row is performed on the sub-blocks excluding the parity bit parts indicated as "▤" in FIGS. 6 and 7 by an XOR operation, thereby determining final parity bits satisfying Eq. (1).

Further, an initial value of a certain parity bit is not limited to the sub-blocks of the $1^{st}$ row, but it may be selected from the sub-blocks of the other rows excluding the parity bit parts indicated as "▤" in FIG. 6 without performing this parity bit determination procedure.

The method of the present invention as mentioned above may be implemented by a software program that is stored in a computer-readable storage medium such as CD-ROM, RAM, ROM, floppy disk, hard disk, optical magnetic disk, or the like. This procedure may be readily carried out by those skilled in the art; and therefore, details of thereof are omitted here.

While the present invention has been described with respect to the particular embodiments, it will be apparent to those skilled in the art that various changes and modifications may be made without departing from the spirit and scope of the invention as defined in the following claims.

The invention claimed is:

1. A method for encoding an LDPC (Low Density Parity Check) code using the result of checking a previously specified parity, wherein a procedure of determining parity bit parts in an H matrix used for LDPC code encoding of an information sequence of length K to a codeword of length N comprises the steps of:

forming, by a computer, a parity bit check matrix having a dual diagonal structure consisting of (N-K) rows for check nodes and (N-K) columns on the basis of the H matrix;

calculating the values of all the parity bits by inserting a given binary value in sub-blocks, with the parity bit check matrix formed on the H matrix;

if the values of the parity bits are incorrect as the result of checking the calculated values of the parity bits, checking the parity bit corresponding to the sub-block located in the last part of the H matrix;

searching the parity bit parts where the parity bit check result is represented as "1" based on the result of checking the parity bits;

performing an XOR operation in sub-blocks on the parity bit part obtained through simultaneous equations including a modulo 2 operation between the parity bits of the searched parity bit parts and the parity bit parts into which an initially given binary value is inserted; and determining, as the value of the parity bit of the H matrix, the value of the parity bit satisfying the condition that the value obtained by multiplying the H matrix by a code word vector, which is encoded by the H matrix, corresponds to zero ("0").

2. The method of claim 1, wherein in the step of forming a parity bit check matrix, the parity bit check matrix is formed by cyclically shifting all the first column of the parity part of the H matrix by the same number of times.

3. The method of claim 1, wherein in the step of forming a parity bit check matrix, the parity bit check matrix is formed in identity matrices.

4. The method of claim 1, wherein in the step of calculating the values of all the parity bits by inserting the given binary value in sub-blocks, initial values (given binary values) of the parity bits are zero ("0").

5. The method of claim 1, wherein in the step of calculating the values of all the parity bits by inserting a given binary value in sub-blocks, initial values (given binary values) of the parity bits are a combination value of random binary numbers.

6. The method of claim 4, wherein the initial values of the parity bits can be specified in any column of the parity bit check matrix on the H matrix.

7. The method of claim 5, wherein with the initial values of the parity bits specified as the combination value of random binary numbers, in the step of performing an XOR operation, the parity bit part whose value is not changed regardless of LDPC encoding, among the parity bit parts on the H matrix, is excluded from the XOR operation.

* * * * *